United States Patent
Fukuyama et al.

(10) Patent No.: US 9,614,124 B2
(45) Date of Patent: Apr. 4, 2017

(54) SUBSTRATE HAVING ANNEALED ALUMINUM NITRIDE LAYER FORMED THEREON AND METHOD FOR MANUFACTURING THE SAME

(71) Applicants: TOHOKU UNIVERSITY, Sendai, Miyagi (JP); MIE UNIVERSITY, Tsu, Mie (JP)

(72) Inventors: Hiroyuki Fukuyama, Sendai (JP); Hideto Miyake, Tsu (JP)

(73) Assignees: TOHOKU UNIVERSITY, Sendai, Miyagi (JP); MIE UNIVERSITY, Tsu, Mie (JP)

(*) Notice: Subject to any disclaimer, the term of this patent is extended or adjusted under 35 U.S.C. 154(b) by 91 days.

(21) Appl. No.: 14/634,713

(22) Filed: Feb. 27, 2015

(65) Prior Publication Data

US 2016/0254411 A1    Sep. 1, 2016

(51) Int. Cl.
| | |
|---|---|
| *H01L 31/0256* | (2006.01) |
| *H01L 33/12* | (2010.01) |
| *H01L 33/00* | (2010.01) |
| *H01L 33/32* | (2010.01) |
| *H01S 5/323* | (2006.01) |

(52) U.S. Cl.
CPC ............ *H01L 33/12* (2013.01); *H01L 33/007* (2013.01); *H01L 33/0095* (2013.01); *H01L 33/32* (2013.01); *H01S 5/323* (2013.01); *H01S 2304/04* (2013.01)

(58) Field of Classification Search
CPC ... H01L 29/15; H01L 31/0256; H01L 33/007; H01L 33/32; H01L 33/0095; H01L 33/12
USPC .......................................................... 257/76
See application file for complete search history.

(56) References Cited

U.S. PATENT DOCUMENTS

| 7,771,849 B2 | 8/2010 | Shibata et al. | |
| 2003/0176001 A1* | 9/2003 | Fukuyama | C30B 25/02 438/22 |
| 2006/0175619 A1* | 8/2006 | Fukuyama | C30B 25/183 257/79 |

FOREIGN PATENT DOCUMENTS

JP    4943132 B2    5/2012

OTHER PUBLICATIONS

Yusuke Katagiri et al., "Low-pressure HVPE growth of crack-free thick AlN on a trench-patterned AlN template", Journal of Crystal Growth, vol. 311 No. 10, Jan. 14, 2009, pp. 2831-2833.

(Continued)

*Primary Examiner* — Tuan Nguyen
(74) *Attorney, Agent, or Firm* — Rabin & Berdo, P.C.

(57) ABSTRACT

A substrate having an annealed AlN layer includes a substrate made of a material selected from among a group including sapphire, silicon carbide (SiC), and aluminum nitride (AlN), and an aluminum nitride (AlN) layer formed on the substrate and having a thickness of 100 nm or greater. The aluminum nitride layer is annealed at a prescribed annealing temperature and in a nitrogen/carbon monoxide ($N_2$/CO) mixed gas atmosphere, and the nitrogen/carbon monoxide ($N_2$/CO) mixed gas has a mixture ratio of $N_2$ gas/CO gas in a range of 0.95/0.05 to 0.4/0.6.

17 Claims, 9 Drawing Sheets

(56) References Cited

OTHER PUBLICATIONS

Gou Nishio, Hideto Miyake, Kazumasa Hiramatsu, Hiroyuki Fukuyama, Draft of "Control of AlN buffer layer by annealing in N2-CO for growth of AlN on sapphire" Mie University, Grad. Sch. Eng., Tohoku University IMRAM; 2013 Autumn Meeting of the Japan Society of Applied Physics, Draft release date (Publication date): Aug. 31, 2013.
Gou Nishio, Hideto Miyake, Kazumasa Hiramatsu, Tohoku Univ., IMRAM: Hiroyuki Fukuyama,Mie University, Grad. Sch. Eng., "Control of AlN buffer layer by annealing in $N_2$-CO for growth of AlN on sapphire" 74th Autumn Meeting of the Japan Society of Applied Physics, Sep. 16-20, 2013.
Hiroyuki Fukuyama et al., "*Single crystalline aluminum nitride films fabricated by nitriding $\alpha$-$Al_2O_3$*" Journal of Applied Physics, vol. 100, (2006), pp. 024905-1 to 024905-7.
Hiroyuki Fukuyama et al., "*Nitridation behavior of sapphire using a carbon-saturated $N_2$-CO gas mixture*" Journal of Applied Physics, vol. 107, (2010), pp. 043502-1 to 043502-7.
Wataru Nakao et al., "*Single crystalline AlN film formed by direct nitridation of sapphire using aluminum oxynitride buffer*" Journal of Crystal Growth, vol. 259, (2003), pp. 302-308.

\* cited by examiner

SUBSTRATE HAVING ANNEALED ALUMINUM NITRIDE LAYER FORMED THEREON AND METHOD FOR MANUFACTURING THE SAME

BACKGROUND OF THE INVENTION

1. Technical Field

The present invention relates to a substrate having an aluminum nitride (AlN) layer and a method for manufacturing an aluminum nitride (AlN) layer in which an aluminum nitride (AlN) layer is annealed in a high temperature mixed gas of nitrogen/carbon monoxide ($N_2$/CO) atmosphere to achieve a higher quality aluminum nitride crystalline layer (hereinafter, "AlN layer").

2. Background Art

Ultraviolet light-emitting elements are garnering wide attention as next generation light sources as a replacement for fluorescent lights, for use in high density DVDs, for lasers for use in chemistry, for breaking down pollutants by photocatalysis, for use in He—Cd lasers, as a replacement for mercury lamps, and the like. Such ultraviolet light-emitting elements are made of an AlGaN nitride semiconductor known as a wide gap semiconductor, and are layered on a substrate of a different material such as sapphire.

However, sapphire has a large lattice mismatch with AlGaN, which results in a large number of threading dislocations to form a non-light-emitting recombination center, which results in a marked reduction in internal quantum efficiency.

By contrast, AlN has a lattice constant close to that of AlGaN, and is transparent up to the ultraviolet region of 200 nm, and thus, AlN does not absorb emitted ultraviolet rays, allowing ultraviolet light to be efficiently radiated outside. However, monocrystalline AlN crystals are expensive and can only be obtained in 1 inch increments, thereby making it unsuited for use as a substrate material for an ultraviolet light-emitting element. Sapphire can obtained in 6 inch increments at a low cost. Considering such a situation, if it were possible to form a high quality AlN monocrystalline layer on a sapphire substrate, then an AlGaN light-emitting element using this as a substrate could be formed by quasi-homoepitaxial growth, thereby allowing an ultraviolet light-emitting element having a low crystalline defect concentration to be formed at a low cost.

However, AlN has a large lattice mismatch with sapphire, and thus, an AlN layer grown on sapphire has a large number of threading dislocations. Thus, sapphire is unsuitable for use as a substrate for an AlGaN light-emitting element.

To solve this issue, a method is proposed in which an AlN layer is grown on sapphire by MOVPE, and then, the AlN layer is annealed so as to disperse oxygen atoms in the AlN layer to reduce dislocations (see, Patent Document 1, for example). Also, a method in which an AlN layer is grown by MOVPE on a sapphire substrate that has been provided with grooves, and dislocations are mitigated in the process of filling the grooves (see Non-Patent Document 1, for example).

RELATED ART DOCUMENT

Patent Document

Patent Document 1: Japanese Patent No. 4943132

Non-Patent Document

Non-Patent Document 1: Yusuke Katagiri, Shinya Kishino, Kazuki Okuura, Hideto Miyake, Kazumasa Hiramatu, "Low-pressure HVPE growth of crack-free thick AlN on a trench-patterned AlN template," Journal of Crystal Growth, 2009, Vol. 311, p. 2831-2833

SUMMARY OF THE INVENTION

Problems to be Solved by the Invention

AlN has a large lattice mismatch with sapphire, and thus, an AlN layer grown on sapphire has a large number of threading dislocations. In order to use sapphire as a substrate for an AlGaN light-emitting element, the threading dislocation density in the AlN layer must be reduced. In the methods disclosed in Patent Document 1 and Non-Patent Document 1, complicated processes such as dispersing oxygen atoms or forming grooves are necessary.

The present invention takes into account these problems, and an object thereof is to provide a substrate having an aluminum nitride (AlN) layer and a method for manufacturing an aluminum nitride (AlN) layer by which it is possible to drastically improve crystalline properties of an AlN layer using growth conditions of the currently used MOCVD method without the need for complex processes such as forming grooves in a sapphire substrate, thereby being able to form a high efficiency light-emitting diode (LED) or laser diode (LD) device.

Means for Solving the Problems

As a result of studies in thermodynamics concerning the above-mentioned problem, the inventors of the present invention have found that it is possible to drastically improve the crystalline properties of an AlN layer by growing an AlN layer on a sapphire substrate by an appropriate film-forming method and annealing the AlN layer at a temperature of 1500° C. or greater in a mixed gas atmosphere of nitrogen/carbon monoxide ($N_2$/CO), and have therefore arrived at the present invention.

In one aspect, the present invention provides a substrate having an annealed AlN layer, including a substrate made of a material selected from among a group including sapphire, silicon carbide (SiC), and aluminum nitride (AlN), and an aluminum nitride (AlN) layer formed on the substrate and having a thickness of 100 nm or greater, wherein the aluminum nitride layer is annealed at a prescribed annealing temperature and in a nitrogen/carbon monoxide ($N_2$/CO) mixed gas atmosphere, and wherein the nitrogen/carbon monoxide ($N_2$/CO) mixed gas has a mixture ratio of $N_2$ gas/CO gas in a range of 0.95/0.05 to 0.4/0.6. Preferably, the mixture ratio of the $N_2$ gas/CO gas is set within a range of 0.95/0.05 to 0.4/0.6.

The prescribed annealing temperature and the mixture ratio of the nitrogen/carbon monoxide ($N_2$/CO) mixed gas are set, within a phase stability diagram of an $Al_2O_3$—AlN—C—$N_2$—CO system, to be in a vicinity of a temperature and mixture ratio at which a chemical equilibrium coexistence state between the AlN phase and the $Al_2O_3$ phase is exhibited, the prescribed annealing temperature van be set within a range of 1500° C. to 1750° C., the mixture ratio of the $N_2$ gas/CO gas may be set within a range of 0.95/0.05 to 0.4/0.6.

Further, the prescribed annealing temperature and the mixture ratio of the nitrogen/carbon monoxide ($N_2$/CO) mixed gas are set, within a phase stability diagram of an $Al_2O_3$—AlN—C—$N_2$—CO system, to be in a vicinity of a temperature and mixture ratio at which a chemical equilibrium coexistence state between the AlN phase and the $Al_2O_3$ phase is exhibited. In the present specification, "vicinity" is defined as being within a range of 100 kJ above an equilibrium coexistence line (see bold solid line La of FIG. 2) between AlN and $Al_2O_3$, in a region above the equilibrium coexistence line where the AlN phase is stable. It is preferable that annealing be performed as close as possible to the equilibrium coexistence line, and thus, it is more preferable that "vicinity" mean an area within 50 kJ or less of the equilibrium coexistence line (see range A2 in FIG. 2).

Further, the substrate having an annealed AlN layer may further include an $Al_xGa_yIn_{(1-x-y)}N$ layer ($0 \leq x \leq 1$, $0 \leq y \leq 1$, and $x+y \leq 1$) formed by regrowth on the annealed aluminum nitride (AlN) layer.

In this case, a concentration of carbon (C) contained in the aluminum nitride (AlN) layer may be greater than a concentration of carbon (C) included in a region of the $Al_xGa_yIn_{(1-x-y)}N$ layer ($0 \leq x \leq 1$, $0 \leq y \leq 1$, and $x+y \leq 1$) excluding a vicinity of a surface thereof.

Further, the concentration of carbon (C) contained in the aluminum nitride (AlN) layer may be $10^{18}$ to $10^{19}$ atoms/$cm^3$, and a concentration of oxygen (O) may be $10^{20}$ atoms/$cm^3$ or greater.

Furthermore, a full width at half maximum of an x-ray diffraction rocking curve of a (10-12) plane in the annealed aluminum nitride (AlN) layer and/or the $Al_xGa_yIn_{(1-x-y)}N$ layer ($0 \leq x \leq 1$, $0 \leq y \leq 1$, and $x+y \leq 1$) formed by the regrowth may be made to be 300 arcsec or less, and/or a surface roughness root mean square (RMS) thereof may be 1.5 nm or less.

In one aspect, a substrate having an annealed AlN layer, including a substrate made of a material selected from among a group including sapphire, silicon carbide (SiC), and aluminum nitride (AlN), a first layer formed on the substrate, and a second layer formed on the first layer, wherein the first layer is 100 nm or greater in thickness, is an annealed aluminum nitride (AlN) layer, and functions as a buffer layer, and wherein a concentration of carbon (C) contained in the first layer is greater than a concentration of carbon (C) contained in a region of the second layer excluding a vicinity of a surface of the second layer.

In this case, the concentration of carbon (C) contained in the annealed aluminum nitride (AlN) layer may be $10^{18}$ to $10^{19}$ atoms/$cm^3$, and a concentration of oxygen (O) may be $10^{20}$ atoms/$cm^3$ or greater.

Further, the second layer may be an $Al_xGa_yIn_{(1-x-y)}N$ layer ($0 \leq x \leq 1$, $0 \leq y \leq 1$, and $x+y \leq 1$) formed by regrowth on the first layer. In this case, a full width at half maximum of an x-ray diffraction rocking curve of a (10-12) plane of the first layer and/or the second layer may be 300 arcsec or less, and/or a surface roughness root mean square (RMS) thereof may be 1.5 nm or less.

Further, preferably, a thickness of the annealed aluminum nitride (AlN) layer is 100 nm to 3000 nm, and more preferably, a thickness of the annealed aluminum nitride (AlN) layer is 100 nm to 1000 nm.

Further, the first layer is annealed at a prescribed annealing temperature and in a nitrogen/carbon monoxide ($N_2$/CO) mixed gas atmosphere, and wherein the prescribed annealing temperature and a mixture ratio of the nitrogen carbon monoxide ($N_2$/CO) mixed gas may be set on the basis of a phase stability diagram of an $Al_2O_3$—AlN—C—$N_2$—CO system.

Furthermore, the first layer is annealed at a prescribed annealing temperature and in the nitrogen/carbon monoxide ($N_2$/CO) mixed gas atmosphere, and the prescribed annealing temperature and the mixture ratio of the mixed gas of nitrogen/carbon monoxide ($N_2$/CO) may be respectively set to be in a vicinity of a temperature and mixture ratio at which a chemical equilibrium coexistence state is exhibited between the AlN phase and the $Al_2O_3$ phase in the $Al_2O_3$—AlN—C—$N_2$—CO system phase stability diagram.

In one aspect, a method for manufacturing a substrate having an annealed AlN layer, including forming an aluminum nitride (AlN) layer to a thickness of 100 nm or greater on a substrate, and annealing the aluminum nitride (AlN) layer at a prescribed annealing temperature and in a nitrogen/carbon monoxide ($N_2$/CO) mixed gas atmosphere, wherein, in the step of annealing, the annealing is performed in the nitrogen/carbon monoxide ($N_2$/CO) mixed gas atmosphere, and the mixed gas has a mixture ratio of $N_2$ gas/CO gas within a range of 0.95/0.05 to 0.4/0.6.

Here, in the step of annealing, the prescribed annealing temperature and the mixture ratio of the nitrogen/carbon monoxide ($N_2$/CO) mixed gas atmosphere during the annealing are determined on the basis of a phase stability diagram of an $Al_2O_3$—AlN—C—$N_2$—CO system, the prescribed annealing temperature may be set within a range of 1500° C. to 1750° C., and the mixture ratio of the $N_2$ gas/CO gas may be set within a range of 0.95/0.05 to 0.4/0.6.

Further, in the step of annealing, the prescribed annealing temperature and the mixture ratio of the nitrogen/carbon monoxide ($N_2$/CO) mixed gas atmosphere during the annealing may be set, within a phase stability diagram of an $Al_2O_3$—AlN—C—$N_2$—CO system, to be in a vicinity of a temperature and mixture ratio at which a chemical equilibrium coexistence state is exhibited between the AlN phase and the $Al_2O_3$ phase, the prescribed annealing temperature may be set within a range of 1500° C. to 1750° C., and the mixture ratio of the $N_2$ gas/CO gas may be set within a range of 0.95/0.05 to 0.4/0.6.

Further, the method may further include regrowing an $Al_xGa_yIn_{(1-x-y)}N$ layer ($0 \leq x \leq 1$, $0 \leq y \leq 1$, and $x+y \leq 1$) on the annealed aluminum nitride (AlN) layer.

Furthermore, in the step of forming an aluminum nitride (AlN) layer, preferably, an aluminum nitride (AlN) layer having a thickness of 100 nm to 3000 nm may be formed on the substrate, and more preferably, a thickness of the annealed aluminum nitride (AlN) layer may be less than 1000 nm.

The above and other objects, features and advantages of the present invention will become more fully understood from the detailed description given hereinbelow and the accompanying drawings which are given by way of illustration only, and thus are not to be considered as limiting the present invention.

DETAILED DESCRIPTION

Below, a substrate having an aluminum nitride (AlN) layer of an embodiment of the present invention and a method for manufacturing an aluminum nitride (AlN) layer will be described in detail with reference to drawings.

Figure 1A:
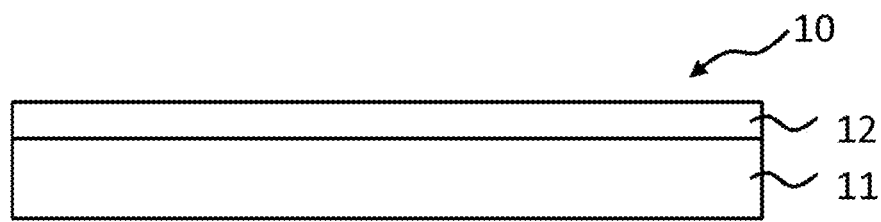
FIG. 1A shows a substrate having an annealed AlN layer according to Embodiment 1 of the present invention.

First a substrate having an annealed AlN layer according to Embodiment 1 of the present invention will be described. FIG. 1A shows a substrate having an annealed AlN layer according to Embodiment 1 of the present invention. As shown in FIG. 1, a substrate 10 having an annealed AlN layer has a substrate 11 and an annealed AlN layer 12 (annealed aluminum nitride layer) formed on the substrate 11. The substrate 11 is a monocrystalline or polycrystalline substrate made of a material selected from among a group including sapphire, silicon carbide (SiC), and aluminum nitride (AlN). Also, the annealed AlN layer 12 is made by annealing an aluminum nitride (AlN) layer having a thickness (film thickness) of 100 nm or greater in a mixed gas of nitrogen/carbon monoxide ($N_2$/CO) atmosphere having a prescribed annealing temperature and prescribed mixture ratio. This mixed gas of nitrogen/carbon monoxide ($N_2$/CO) has a ratio of $N_2$ gas/CO gas in a range of 0.95/0.05 to 0.4/0.6.

Figure 2:
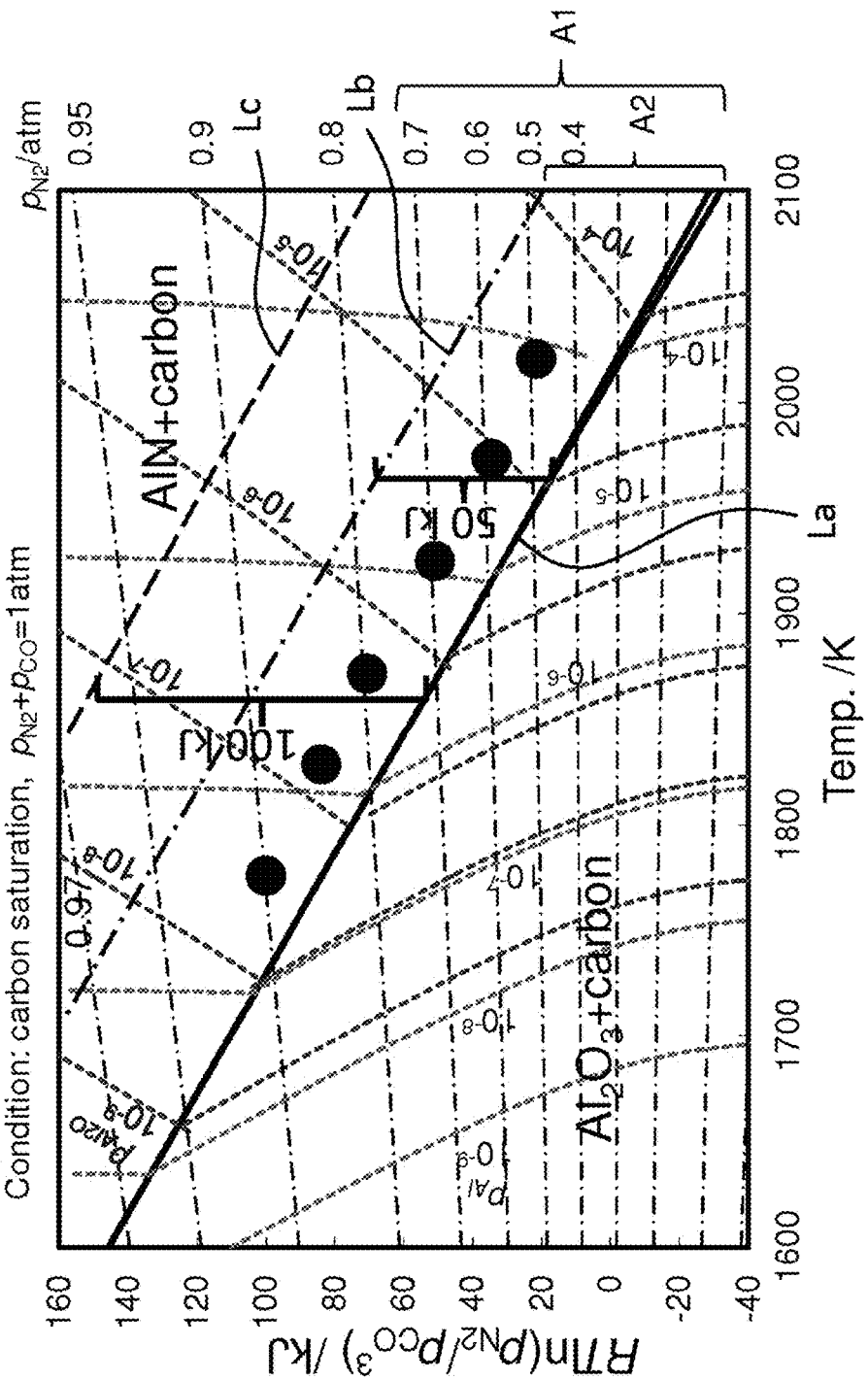
FIG. 2 is a drawing showing a thermodynamically stable phase in an $Al_2O_3$—AlN—C—$N_2$—CO system.

Here the annealing temperature and the ratio of the $N_2$/CO mixed gas is determined by the following thermodynamic considerations. FIG. 2 shows a stable phase drawing in an $Al_2O_3$—AlN—C—$N_2$—CO system. In FIG. 2, the horizontal axis represents the absolute temperature (Kelvin (K)), and the vertical axis shows the standard Gibb's energy (kJ) of the reaction represented in:

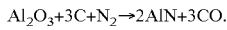

$Al_2O_3+3C+N_2\rightarrow 2AlN+3CO$.

The inventors of the present invention and the like have diligently performed experimental work and have created the stable phase drawing of the $Al_2O_3$—AlN—C—$N_2$—CO system shown in FIG. 2. This drawing shows a stable region of $Al_2O_3$ and AlN as a function of temperature and the ratio of the $N_2$/CO (nitrogen gas/carbon monoxide gas) mixed gas under conditions including carbonation and that the sum of partial pressures of $N_2$ and CO gases be 1 atm.

Conventionally, when focusing only on the AlN layer, sufficient consideration was given to annealing the AlN layer in a nitrogen gas atmosphere. By contrast, the inventors of the present invention and the like have considered forming the AlN layer on the oxide substrate 11 made of sapphire and raising the annealing temperature to 1500° C. or higher, and have diligently studied creating a stable environment for both the AlN layer and the sapphire substrate. As a result, from the perspective of thermodynamic equilibrium, by creating the phase stability drawing of FIG. 2 for the oxide and nitride to coexist at a high temperature of 1500° C. or greater and using this phase stability drawing, the inventors of the present invention have found that in order to create a region where the AlN is stable, one need only select the temperature and ratio of the $N_2$/CO mixed gas.

The annealing temperature can be selected from within a range of 1500° C. to 1750° C., and the ratio of the $N_2$/CO (nitrogen/carbon monoxide) mixed gas can be selected from within a range of 0.95/0.05 to 0.4/0.6. It is preferable that the mixture ratio of the $N_2$/CO gas be within the range of 0.90/0.10 to 0.5/0.5. The reason for this will be explained below.

The annealing temperature and the mixture ratio of the mixed gas of nitrogen/carbon monoxide ($N_2$/CO) can respectively be set to be in the vicinity of the temperature and mixture ratio at which a chemical equilibrium coexistence state is exhibited between the AlN phase and the $Al_2O_3$ phase in the $Al_2O_3$—AlN—C—$N_2$—CO system stability diagram shown in FIG. 2. Here, not only can a sapphire substrate be used, but a silicon carbide (SiC) substrate or an aluminum nitride (AlN) substrate can be used. In other words, in the case of a substrate material stable in contact with the AlN layer, at least ensuring only the stability of the AlN layer is important, and it is possible to attain similar effects by performing annealing under a condition in which the AlN layer is stable in the $Al_2O_3$—AlN—C—$N_2$—CO system stability diagram of FIG. 2.

Here, "the vicinity of the temperature and mixture ratio at which the chemical equilibrium coexistence state is exhibited between the AlN phase and the $Al_2O_3$ phase" refers to the vicinity of the equilibrium coexistence line (bold solid line La in FIG. 2) indicating a condition in which AlN and $Al_2O_3$ can coexist in an equilibrium phase. In FIG. 2, the portion above the equilibrium coexistence line (bold solid line La) indicates the region where the AlN phase is stable. In FIG. 2, the bold solid line La indicates the equilibrium coexistence line between the AlN phase and the $Al_2O_3$ phase, and the one-dot chain line Lb indicates the boundary of the region A2, which is 50 kJ above the equilibrium coexistence line (bold solid line La). Additionally, the broken line Lc indicates the boundary of the region A2 100 kJ above the equilibrium coexistence line (bold solid line La).

Here, in the present specification, the vicinity of the temperature and mixture ratio at which the chemical equilibrium coexistence state is exhibited between the AlN phase and the $Al_2O_3$ phase is defined as a range greater than the equilibrium coexistence line (bold solid line La) by 100 kJ or less (region A1 in an area between the bold solid line La and the broken line Lc inclusive). The mixture ratio of the $N_2$/CO (nitrogen/carbon monoxide) gases is in the range of 0.95/0.05 to 0.4/0.6, which is in the range A1 in this vicinity. Furthermore, because it is preferable that annealing be performed under conditions closer to the equilibrium coexistence line (bold solid line La), this vicinity is more preferably in a range at or less than 50 kJ above the equilibrium coexistence line (bold solid line La) (region A2 between the bold solid line La and the one-dot chain line Lb inclusive in FIG. 2).

Figure 3A:
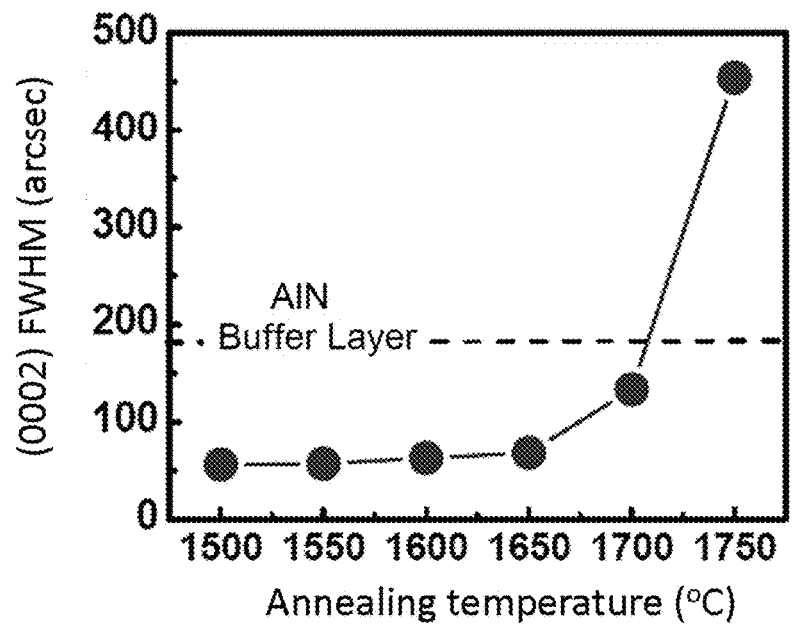
FIG. 3A is a graph showing a relation between an annealing temperature for the annealed AlN layer and a full width at half maximum of an x-ray diffraction rocking curve of the (0002) plane in a example of the present invention.
Figure 3B:
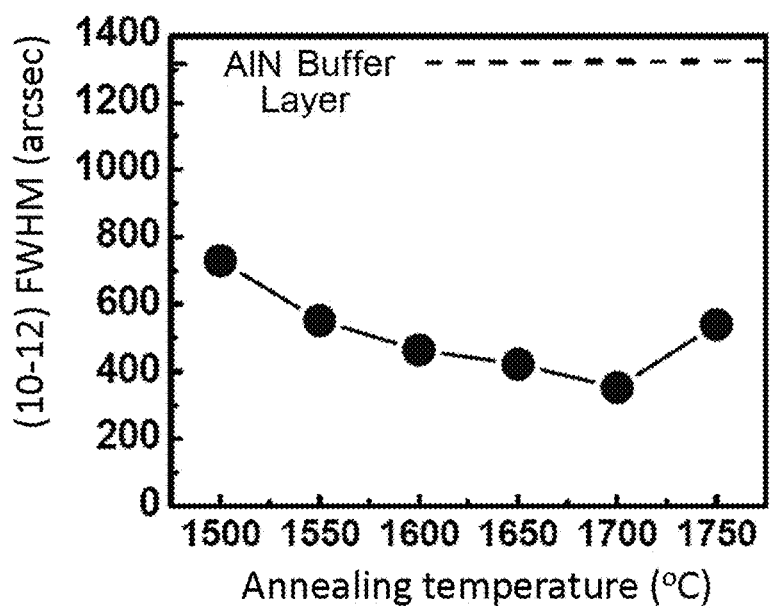
FIG. 3B is a graph showing a relation between an annealing temperature for the annealed AlN layer and a full width at half maximum of an x-ray diffraction rocking curve of the (10-12) plane in a example of the present invention.

FIGS. 3A and 3B are respectively graphs showing a relation between an annealing temperature for the annealed AlN layer of the present invention and a full width at half maximum of an x-ray diffraction rocking curve of the (0002) plane and the (10-12) plane. As shown in FIG. 3A, if the annealing temperature increases to higher than 1750° C., the surface of the AlN layer becomes rough due to thermal degradation of the AlN layer, which means that the value of the (0002) FWHM deteriorates. Thus, it is preferable that the annealing temperature be 1750° C. or less. On the other hand, as shown in FIG. 3B, if the annealing temperature is less than 1500° C., the (10-12) FWHM value becomes high, and there is a tendency for the annealing effect not to be sufficient. Thus, it is preferable that the annealing temperature be 1500° C. or greater.

In the substrate 10 having the annealed AlN layer of the present embodiment, it is possible to perform such annealing in a graphite reactor under carbon saturation. By performing annealing in a mixed gas of nitrogen/carbon monoxide ($N_2$/CO) atmosphere having a prescribed annealing temperature and a prescribed mixture ratio, the concentration of carbon (C), which is an impurity included in the annealed AlN layer 12 becomes $10^{18}$ to $10^{19}$ atoms/$cm^3$. By including a relatively high concentration of the impurity carbon, the annealed AlN layer 12 can take on a color or absorb light, but does not pose a problem for use in a light-emitting device, and no negative effects such as corrosion or generation of compounds occurs. Furthermore, the annealed AlN layer 12 can have a high oxygen (O) concentration of $10^{20}$ atoms/$cm^3$ or greater. Also, it is possible to set the full width at half maximum of an x-ray diffraction rocking curve at the (10-12) plane in the annealed aluminum nitride (AlN) layer 12 to 300 arcsec or less, and the roughness mean square thereof is 1.5 nm or less.

Here, it is preferable that the annealed AlN layer 12 be 100 nm or greater and 3000 nm or less in thickness. It is even more preferable that the annealed AlN layer 12 be 1000 nm or less in thickness. The annealed AlN layer 12 is annealed in a mixed gas of nitrogen/carbon monoxide ($N_2$/CO) as described above, and thus, the concentration of carbon (C) in the annealed AlN layer 12 increases, but an AlN layer having excellent crystalline properties is formed. As will be described later, according to the substrate 10 having the annealed AlN layer 12 having such characteristics, it is possible to form an a regrowth layer 13 (see FIG. 1B) on the substrate 10 having the annealed AlN layer 12, or in other words, on the annealed AlN layer 12, the regrowth layer 13 being an AlN layer having excellent crystalline properties, an $Al_xGa_yIn_{(1-x-y)}N$ layer ($0 \le x \le 1$, $0 \le y \le 1$, and $x+y \le 1$), or a laminated layer including these.

In this manner, it is possible to attain a substrate 10 having an annealed AlN layer 12 with excellent crystalline properties, which cannot normally be obtained by MOVPE alone, by determining the annealing temperature within the range of 1500° C. to1750° C. and determining the mixture ratio of the mixed gas of $N_2$/CO (nitrogen gas/carbon monoxide gas) within the range of 0.95/0.05 to 0.4/0.6 on the basis of the $Al_2O_3$—AlN—C—$N_2$—CO system phase stability drawing shown in FIG. 2, and further making the thickness of the AlN layer to be annealed within the range of 100 nm to 3000 nm in thickness.

Figure 1B:
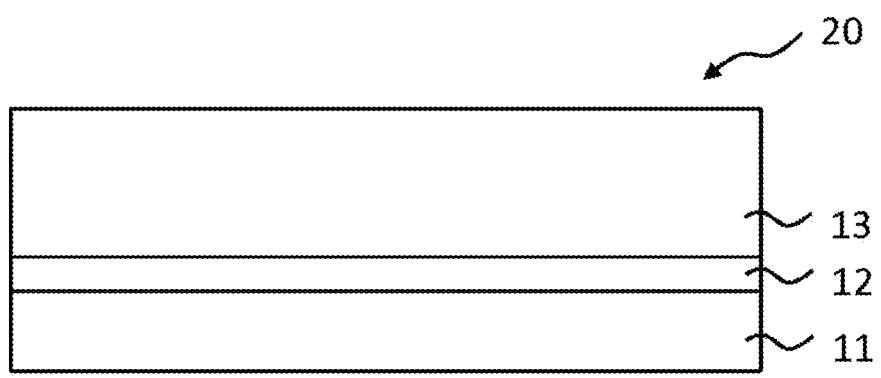
FIG. 1B shows a substrate having an annealed AlN layer according to Embodiment 2 of the present invention.

FIG. 1B shows a substrate having an annealed AlN layer according to Embodiment 2 of the present invention. As shown in FIG. 1B, the substrate 20 having the annealed AlN layer has a substrate 11, an annealed AlN layer 12 (annealed aluminum nitride layer) as a first layer formed on the substrate 11, and a second layer 13 formed on the annealed AlN layer 12.

As in Embodiment 1, the substrate 11 can be a monocrystalline or polycrystalline substrate made of a material selected from among a group including sapphire, silicon carbide (SiC), and aluminum nitride (AlN).

The annealed AlN layer 12 is 100 nm or greater in thickness, is an annealed aluminum nitride (AlN) layer, and functions as a buffer layer. In the substrate 20 having the annealed AlN layer of the present embodiment, the concentration of carbon (C) included in the annealed AlN layer 12 is greater than the concentration of carbon (C) included in the region excluding the vicinity of the surface of the second layer 13. This is a distinct characteristic of the present embodiment resulting from performing annealing in the mixed gas of nitrogen/carbon monoxide ($N_2$/CO) when forming the annealed AlN layer 12. The concentration of carbon (C) included in the annealed AlN layer 12 is $10^{18}$ to $10^{19}$ atoms/$cm^3$, and the concentration of oxygen (O) is $10^{20}$ atoms/$cm^3$ or greater.

It is preferable that the second layer 13 be an $Al_xGa_yIn_{(1-x-y)}N$ layer ($0 \le x \le 1$, $0 \le y \le 1$, and $x+y \le 1$) (also referred to as the regrowth layer below) formed by regrowth on the annealed AlN layer 12.

Also, as in Embodiment 1, the annealed AlN layer 12 is made by annealing an aluminum nitride (AlN) layer having a thickness of 100 nm or greater in a mixed gas of nitrogen/carbon monoxide ($N_2$/CO) having a prescribed annealing temperature and prescribed mixture ratio. The annealing temperature and the mixture ratio of the mixed gas of nitrogen/carbon monoxide ($N^2$/CO) are determined on the basis of the $Al_2O_3$—AlN—C—$N_2$—CO system stability drawing of FIG. 2 as described above, and the annealing temperature is set to 1500° C. or greater.

As in Embodiment 1, the annealing temperature for the annealed AlN layer 12 and the mixture ratio of the mixed gas of nitrogen/carbon monoxide ($N_2$/CO) are respectively set to be in the vicinity of the temperature and mixture ratio at which the chemical equilibrium coexistence state is exhibited between the AlN phase and the $Al_2O_3$ phase in the $Al_2O_3$—AlN—C—$N_2$—CO system phase stability diagram shown in FIG. 2.

It is preferable that the annealed AlN layer 12 be 100 nm or greater in thickness and 3000 nm or less in thickness. It is further preferable that the thickness be 1000 nm or less. As described above, the annealed AlN layer 12 includes carbon (C) atoms as an impurity, and thus, the buffer layer simply needs to have a thickness by which it is possible to grow the regrowth layer 13 having excellent crystalline characteristics thereabove. If the annealed AlN layer 12 is made thinner than 100 nm, then surface roughness (recesses and protrusions) increases. If the annealed AlN layer 12 is made to be thicker than 3000 nm, stress at the interface between the substrate 11 made of sapphire or the like and the annealed AlN layer 12 results in the annealed AlN layer 12 being susceptible to cracking, and thus, it is preferable that the annealed AlN layer 12 be 3000 nm or less in thickness. In the substrate 20 having the annealed AlN layer of the present embodiment, the concentration of impurity carbon (C) atoms is greater in the annealed AlN layer 12 than in the second layer 13, and thus, it is possible to reduce the above-mentioned effect by making the thickness of the annealed AlN layer 12 less than or equal to a thickness needed to attain an excellent second layer 13, which is the regrowth layer. Thus, it is even more preferable that the thickness of the annealed AlN layer 12 be 1000 nm or less.

In the present embodiment, the full width at half maximum of the x-ray diffraction rocking curve of the (10-12) plane of at least one of the annealed aluminum nitride (AlN) layer 12 and the $Al_xGa_yIn_{(1-x-y)}N$ layer 13 ($0 \leq x \leq 1$, $0 \leq y \leq 1$, and $x+y \leq 1$) can be made to be 300 arcsec or less. Similarly, at least one of these layers can be made to have a roughness mean square of 1.5 nm or less.

In this manner, from the annealing temperature range of 1500° C. to 1750° C., the mixture ratio of the $N_2$/CO (nitrogen gas/carbon monoxide gas) is set within the range of 0.95/0.05 to 0.4/0.6 on the basis of the $Al_2O_3$—AlN—C—$N_2$—CO system stability drawing shown in FIG. 2, and furthermore, the thickness of the AlN layer 12 to be annealed is set to 100 nm to 3000 nm, and thus, the full width at half maximum of the x-ray diffraction rocking curve of the (10-12) plane of at least one of the annealed AlN layer 12 and the regrowth layer 13 is set to 300 arcsec or less, for example, and the roughness mean square of at least one of the layers is set to 1.5 nm or less, thereby attaining a substrate 10 having an annealed AlN layer having excellent crystalline properties not attainable by the normal MOVPE method.

In this manner, in the substrates 10 and 20 having the annealed AlN layers of Embodiments 1 and 2, the threading dislocation density in the annealed AlN layer 12 and the second layer 13 grown thereon can be reduced, and thus, the substrates 10 and 20 can be used as substrates of light-emitting elements, for example. In the light-emitting element, an AlGaInN type light-emitting layer of varying composition depending on the wavelength of light to be emitted by the element is stacked on the substrate. By stacking the AlGaInN type light-emitting layers respectively on the substrates 10 and 20 having the annealed AlN layers according to Embodiments 1 and 2, it is possible to provide a light-emitting element substrate having excellent crystalline properties. As described above, there is a large lattice mismatch between the sapphire and the AlN layer, and thus, it was difficult to form an AlN layer having excellent crystalline properties on the sapphire substrate. By contrast, the substrates 10 and 20 having the annealed AlN layer of these embodiments have excellent crystalline properties, and thus, it is possible to use a sapphire substrate or the like and form as the light-emitting layer an AlGaN type nitride semiconductor layer, an AlGaInN type nitride semiconductor layer, or the like having excellent crystalline matching properties with the AlN layer. In other words, in these embodiments, it is possible to provide a lower cost substrate by forming an annealed AlN layer as the buffer layer on the sapphire substrate compared to forming such nitride semiconductor layers on expensive bulk monocrystalline AlN crystals.

Figure 4:
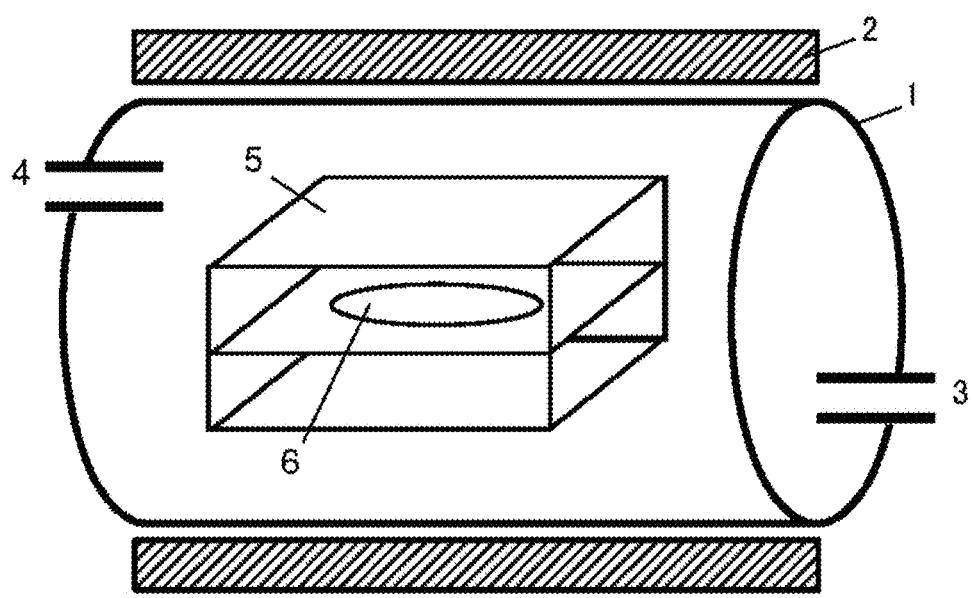
FIG. 4 is a schematic view showing an annealing device for the AlN layer used in a method for manufacturing an aluminum nitride (AlN) layer according to an embodiment of the present invention.

Next, a method for manufacturing an aluminum nitride (AlN) layer according to Embodiment 3 of the present invention will be described. In the present embodiment, the sapphire substrate having formed thereon the AlN layer to be the annealed AlN layer is annealed in a mixed gas of nitrogen/carbon monoxide ($N_2$/CO). FIG. 4 shows a configuration example of an annealing device. The annealing device includes a graphite reaction vessel 1, heaters 2, a gas intake unit 3, a gas exhaust unit 4, and a substrate holding unit 5, and the sapphire substrate 6 having formed thereon the AlN layer is disposed in a holding furnace unit. The substrate holding unit 5 is made of a material resistant to high temperatures, and can be made of aluminum nitride, boron nitride, graphite, or the like, for example.

The MOVPE method is used to form the sapphire substrate 6 on which the AlN layer is formed. However, the method of forming the AlN layer is not limited to the MOVPE method, and an appropriate film-forming method is used. Sputtering, hydride vapor phase epitaxy (HVPE), molecular beam epitaxy (MBE), and the like can be used. Also, the material of the substrate on which the AlN layer is formed is not limited to being a sapphire substrate, and an SiC substrate, an AlN substrate, and the like can be used.

The method of heating the sapphire substrate on which the AlN layer has been formed (hereinafter referred to as the AlN/sapphire substrate) will be described. As shown in FIG. 4, the sapphire substrate is disposed in the holding furnace unit of the reaction vessel 1. First, after using a rotary pump to clear the interior of the reaction vessel 1, the $N_2$/CO mixed gas is introduced therein by the gas intake unit 3. Also, in the present embodiment, the capacity of the reaction vessel 1 is 250 L, for example.

Once the introduced $N_2$/CO mixed gas reaches 1.0 atm, heating of the AlN/sapphire substrate is started. During heating, the mixed gas continues to flow at 2.0 L/min, and is cleared to outside of the reaction vessel 1 by the gas exhaust unit 4. At this time, the ratio of the $N_2$/CO mixed gas and the annealing temperature are selected according to FIG. 2, and are as follows: $N_2$/CO=0.95/0.05 to 0.4/0.6, annealing temperature: 1500-1700° C. (1773-2023 K).

As described above, in FIG. 2, the bold solid line La indicates a condition in which AlN and $Al_2O_3$ can coexist in an equilibrium phase, and the portion above the solid line is where the AlN phase is present in a stable state, and the portion below the solid line is where the $Al_2O_3$ is present in a stable state. When annealing the AlN layer formed on the sapphire substrate, it is necessary to select a condition close to both the region where the AlN layer is stable and the region where the sapphire ($Al_2O_3$) forming the substrate is stable. As described above, in FIG. 2, the region A1 between the bold solid line La and the broken line Lc indicates the stable region of the AlN layer, and as long as the annealing temperature and the mixture ratio of the $N_2$/CO mixed gas is selected to be inside the region A1, this will generally create a suitable condition for annealing the AlN layer. In order to select a condition better suited for annealing, it is preferable that the annealing temperature and the $N_2$/CO mixed gas be set within the region A2 between the bold line La and the one-dot chain line Lb.

Furthermore, the main characteristic of annealing is that the diffusion of atoms induces realignment, and thus, it is preferable that the temperature be as high as possible within a range that the material can endure. In other words, in the present embodiment, it is preferable that annealing be performed at a high temperature that can be endured by the sapphire (oxide) substrate 11 and the AlN layer. Here, the higher the annealing temperature is within this range, the closer the condition can be to the bold solid line La where both are in equilibrium; that is, it is possible to select a more optimal annealing temperature and $N_2$/CO gas mixture ratio in the range A2 than for the range A1.

When annealing the AlN layer, it is important that a condition optimized for annealing be realized. Thus, a graphite reaction vessel 1 having an open system in which the mixed gas at a set mixture ratio is introduced or cleared at a fixed flow rate is used, but if it is possible to sufficiently suppress the generation of unwanted gas and unwanted molecules in the vessel and maintain a certain pressure, then a graphite reaction vessel having a closed system in which gas is not cleared out may be used.

Figure 5A:
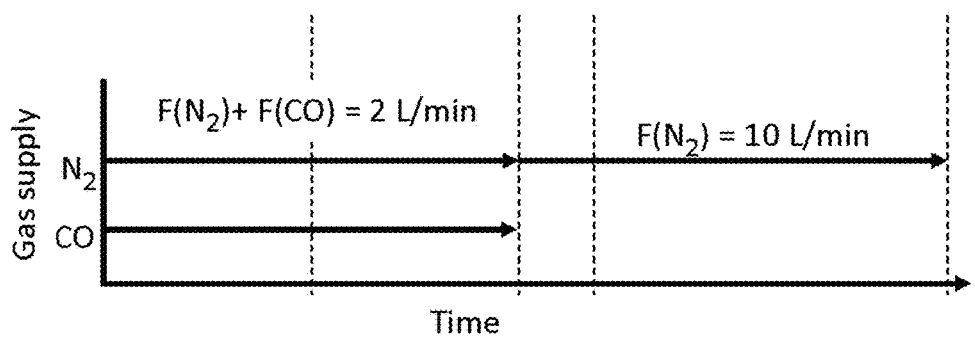
FIG. 5A shows an annealing process with the horizontal axis being the annealing time and the vertical axis being the amount of $N_2$ gas and CO gas flowing.
Figure 5B:
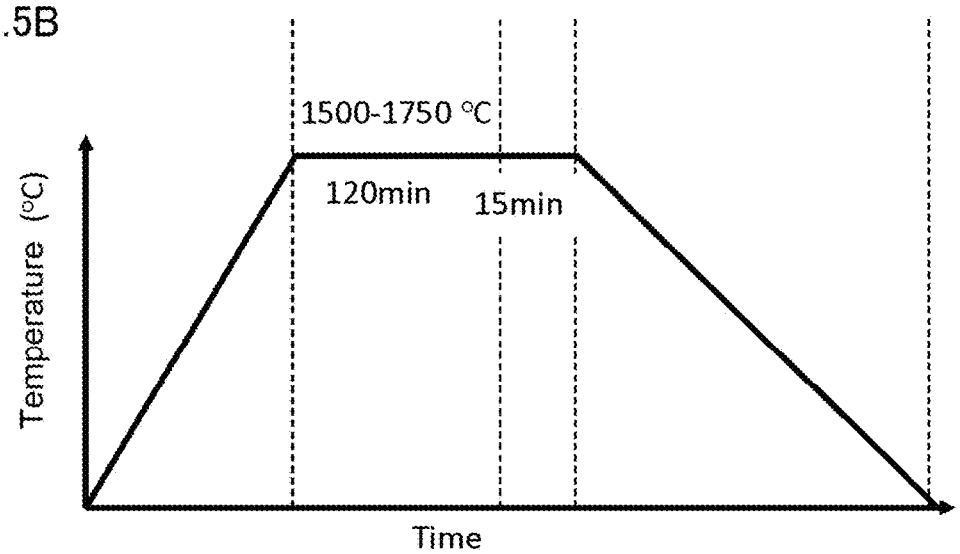
FIG. 5B shows an annealing process of an embodiment of the present invention with the horizontal axis being the annealing time and the vertical axis being the annealing temperature.

FIGS. 5A and 5B indicate an annealing process; the horizontal axes indicate the annealing time, and the vertical axes respectively indicate the flow rate of $N_2$ gas and CO gas, and the annealing temperature. Here, F(i) indicates the flow rate (L/min) of a gas component i.

The heating rate is approximately 10° C./min to reach a prescribed annealing temperature, and once the prescribed annealing temperature is reached, the temperature is maintained for two hours. Then, only $N_2$ gas flows in for 15 minutes at a rate of 10 L/min, and CO gas in the reaction vessel 1 is cleared out, after which the heater 2 stops heating, and then the mixture is cooled for approximately four hours to room temperature. If cooling takes place with CO gas remaining inside the vessel, then the reaction $2CO \rightarrow C+CO_2$ occurs, and C accumulates on the substrate surface. In order to prevent this, the mixture is cooled after the inside of the vessel has been filled with $N_2$ only and the CO gas has been cleared out.

A commercially available liquid nitrogen cylinder or a commercially available heavy nitrogen gas cylinder can be used as the source for $N_2$. A commercially available high CO gas cylinder can be used as the source for CO.

As described above, by annealing the AlN layer/sapphire substrate in the $N_2$/CO mixed gas, an annealed AlN layer having excellent crystalline properties can be formed.

Furthermore, by regrowing the AlN layer (regrowth layer) to 500 nm or greater on the AlN layer/sapphire that has been annealed, it is possible to attain an AlN regrowth layer having excellent surface flatness and crystalline properties. The regrowth layer can be made to be 50 nm to 10mm in thickness, for example. As described above, the AlN layer that is the regrowth layer can have an $Al_xGa_yIn_{(1-x-y)}N$ layer ($0 \leq x \leq 1$, $0 \leq y \leq 1$, and $x+y \leq 1$) and a multilayer structure including this layer.

Below, the present invention will be explained with reference to examples, but the present invention is not limited to these examples.

EXAMPLE 1

First, an AlN layer was formed to approximately 300 nm by MOVPE on the c surface of the sapphire substrate having a diameter of 2 inches, at a growth temperature of 1150° C. The crystalline properties of the AlN layer were as follows: the FWHM of the XRC of the (0002) AlN was 90 arcsec, the FWHM of the XRC of the (10-12) AlN was 1278 arcsec, and the FWHM of the XRC of the (10-10) AlN was 1508 arcsec. Also, the roughness mean square (RMS) of the surface was 3.10 nm. This AlN/sapphire substrate was divided into four equal parts, of which one piece was annealed as follows. (0002), (10-12), and (10-10) show an AlN crystalline lattice surface having a wurtzite structure according to four axes using a Miller coefficient.

As shown in FIG. 4, the sapphire substrate was disposed in the holding furnace unit of the reaction vessel 1. First, after using a rotary pump to clear the interior of the reaction vessel 1, the $N_2$/CO mixed gas was introduced therein by the gas intake unit 3. The mixture ratio of the $N_2$/CO mixed gas was 0.70/0.30. Once the introduced $N_2$/CO mixed gas reached 1.0 atm, heating of the AlN/sapphire substrate was started. During heating, the mixed gas continued to flow at 2.0 L/min, and was cleared to outside of the reaction vessel 1 by the gas exhaust unit 4. The heating rate was approximately 10° C./min and the mixture was heated to 1650° C. and maintained at that temperature for two hours. Then, $N_2$ gas only flowed in for 15 minutes at a rate of 10 L/min, and CO gas in the reaction vessel 1 was cleared out, after which the heater 2 stopped heating, and then the mixture was cooled for approximately four hours to room temperature.

As a result, the crystalline properties of the AlN layer were as follows: the FWHM of the XRC of the (0002) AlN was 32 arcsec, the FWHM of the XRC of the (10-12) AlN was 424 arcsec, and the FWHM of the XRC of the (10-10) AlN was 532 arcsec. Also, the roughness mean square (RMS) of the surface was 0.49 nm, and compared to before annealing, excellent crystalline properties and surface smoothness were seen. In the present invention, it was found that in order to dramatically improve surface smoothness as described above, it is important to realize a stable state close to the chemical equilibrium state shown in the bold solid line La shown in FIG. 2 during annealing.

EXAMPLE 2

The AlN/sapphire substrate used herein was formed in Example 1 by MOVPE, and is one of the four equally formed pieces. Annealing was performed in Example 2 in a manner similar to Example 1 other than that the $N_2$/CO mixed gas ratio was set to 0.80/0.20, and that the annealing temperature was set to 1600° C.

As a result, the crystalline properties of the AlN layer were as follows: the FWHM of the XRC of the (0002) AlN was 97 arcsec, the FWHM of the XRC of the (10-12) AlN was 468 arcsec, and the FWHM of the XRC of the (10-10) AlN was 662 arcsec. Also, the roughness mean square (RMS) of the surface was 0.63 nm, and compared to before annealing, excellent crystalline properties and surface smoothness were seen.

EXAMPLE 3

The AlN/sapphire substrate used herein was formed in Example 1 by MOVPE, and is one of four equally formed pieces. Annealing was performed in Example 3 in a manner similar to Example 1 other than that the $N_2$/CO mixed gas ratio was set to 0.85/0.15, and that the annealing temperature was set to 1550° C.

As a result, the crystalline properties of the AlN layer were as follows: the FWHM of the XRC of the (0002) AlN was 43 arcsec, the FWHM of the XRC of the (10-12) AlN was 579 arcsec, and the FWHM of the XRC of the (10-10) AlN was 867 arcsec. Also, the roughness mean square (RMS) of the surface was 1.21 nm, and compared to before annealing, excellent crystalline properties and surface smoothness were seen.

EXAMPLE 4

The AlN/sapphire substrate used herein was formed in Example 1 by MOVPE, and is one of the four equally formed pieces. Annealing was performed in Example 4 in a manner similar to Example 1 other than that the $N_2$/CO mixed gas ratio was set to 0.90/0.10, and that the annealing temperature was set to 1500° C.

As a result, the crystalline properties of the AlN layer were as follows: the FWHM of the XRC of the (0002) AlN was 36 arcsec, the FWHM of the XRC of the (10-12) AlN was 730 arcsec, and the FWHM of the XRC of the (10-10) AlN was 1144 arcsec. Also, the roughness mean square (RMS) of the surface was 2.65 nm, and compared to before annealing, excellent crystalline properties and surface smoothness were seen.

EXAMPLE 5

First, an AlN layer was formed to approximately 200 nm by MOVPE on the c surface of the sapphire substrate having a diameter of 2 inches, at a growth temperature of 1150° C.

The crystalline properties of the AlN layer were as follows: the FWHM of the XRC of the (0002) AlN was 43 arcsec, the FWHM of the XRC of the (10-12) AlN was 1386 arcsec, and the FWHM of the XRC of the (10-10) AlN was 1602 arcsec. Also, the roughness mean square (RMS) of the surface was 2.49 nm. This AlN/sapphire substrate was divided into four equal parts, of which one piece was annealed as follows.

Annealing was performed in Example 5 in a manner similar to Example 1 other than that the $N_2$/CO mixed gas ratio was set to 0.80/0.20, and that the annealing temperature was set to 1600° C.

As a result, the crystalline properties of the AlN layer were as follows: the FWHM of the XRC of the (0002) AlN was 36 arcsec, the FWHM of the XRC of the (10-12) AlN was 482 arcsec, and the FWHM of the XRC of the (10-10) AlN was 619 arcsec. Also, the roughness mean square (RMS) of the surface was 1.57 nm, and compared to before annealing, excellent crystalline properties and surface smoothness were seen.

EXAMPLE 6

First, an AlN layer was formed to approximately 100 nm by MOVPE on the c surface of the sapphire substrate having a diameter of 2 inches, at a growth temperature of 1150° C. The crystalline properties of the AlN layer were as follows: the FWHM of the XRC of the (0002) AlN was 28 arcsec, the FWHM of the XRC of the (10-12) AlN was 1771 arcsec, and the FWHM of the XRC of the (10-10) AlN was 2217 arcsec. Also, the roughness mean square (RMS) of the surface was 1.55 nm. This AlN/sapphire substrate was divided into four equal parts, of which one piece was annealed as follows.

Annealing was performed in Example 6 in a manner similar to Example 1 other than that the $N_2$/CO mixed gas ratio was set to 0.80/0.20, and that the annealing temperature was set to 1600° C.

As a result, the crystalline properties of the AlN layer were as follows: the FWHM of the XRC of the (0002) AlN was 39 arcsec, the FWHM of the XRC of the (10-12) AlN was 615 arcsec, and the FWHM of the XRC of the (10-10) AlN was 838 arcsec. Also, the roughness mean square (RMS) of the surface was 0.55 nm, and compared to before annealing, excellent crystalline properties and surface smoothness were seen.

EXAMPLE 7

The AlN/sapphire substrate used herein was formed in Example 6 by MOVPE, and is one of the four equally formed pieces. Annealing was performed in a manner similar to Example 1 using this AlN/sapphire substrate.

As a result, the crystalline properties of the AlN layer were as follows: the FWHM of the XRC of the (0002) AlN was 79 arcsec, the FWHM of the XRC of the (10-12) AlN was 734 arcsec, and the FWHM of the XRC of the (10-10) AlN was 540 arcsec. Also, the roughness mean square (RMS) of the surface was 0.43 nm, and compared to before annealing, excellent crystalline properties and surface smoothness were seen.

EXAMPLE 8

First, an AlN layer was formed to approximately 650 nm by MOVPE on the c surface of the sapphire substrate having a diameter of 2 inches, at a growth temperature of 1150° C. The crystalline properties of the AlN layer were as follows: the FWHM of the XRC of the (0002) AlN was 476 arcsec, the FWHM of the XRC of the (10-12) AlN was 1056 arcsec, and the FWHM of the XRC of the (10-10) AlN was 1282 arcsec. Also, the roughness mean square (RMS) of the surface was 9.78 nm. This AlN/sapphire substrate was divided into four equal parts, of which one piece was annealed as follows.

Annealing was performed in Example 8 in a manner similar to Example 1 other than that the $N_2$/CO mixed gas ratio was set to 0.60/0.40, and that the annealing temperature was set to 1700° C.

As a result, the crystalline properties of the AlN layer were as follows: the FWHM of the XRC of the (0002) AlN was 133 arcsec, the FWHM of the XRC of the (10-12) AlN was 259 arcsec, and the FWHM of the XRC of the (10-10) AlN was 374 arcsec. Also, the roughness mean square (RMS) of the surface was 1.34 nm, and compared to before annealing, excellent crystalline properties and surface smoothness were seen.

EXAMPLE 9

First, an AlN layer was formed to approximately 1000 nm by MOVPE on the c surface of the sapphire substrate having a diameter of 2 inches, at a growth temperature of 1150° C. The crystalline properties of the AlN layer were as follows: the FWHM of the XRC of the (0002) AlN was 439 arcsec, the FWHM of the XRC of the (10-12) AlN was 875 arcsec, and the FWHM of the XRC of the (10-10) AlN was 952 arcsec. Also, the roughness mean square (RMS) of the surface was 14.20 nm. This AlN/sapphire substrate was divided into four equal parts, of which one piece was annealed as follows.

Annealing was performed in Example 9 in a manner similar to Example 1 other than that the $N_2$/CO mixed gas ratio was set to 0.60/0.40, and that the annealing temperature was set to 1700° C.

As a result, the crystalline properties of the AlN layer were as follows: the FWHM of the XRC of the (0002) AlN was 205 arcsec, the FWHM of the XRC of the (10-12) AlN was 288 arcsec, and the FWHM of the XRC of the (10-10) AlN was 511 arcsec. Also, the roughness mean square (RMS) of the surface was 7.50 nm, and compared to before annealing, excellent crystalline properties and surface smoothness were seen.

EXAMPLE 10

First, an AlN layer was formed to approximately 300 nm by MOVPE on the c surface of the sapphire substrate having a diameter of 2 inches, at a growth temperature of 1200° C. The crystalline properties of the AlN layer were as follows: the FWHM of the XRC of the (0002) AlN was 88 arcsec, the FWHM of the XRC of the (10-12) AlN was 1171 arcsec, and the FWHM of the XRC of the (10-10) AlN was 1440 arcsec. Also, the roughness mean square (RMS) of the surface was 4.05 nm. This AlN/sapphire substrate was divided into four equal parts, of which one piece was annealed as follows.

Annealing was performed in Example 10 in a manner similar to Example 1 other than that the $N_2$/CO mixed gas ratio was set to 0.60/0.40, and that the annealing temperature was set to 1700° C.

As a result, the crystalline properties of the AlN layer were as follows: the FWHM of the XRC of the (0002) AlN was 75 arcsec, the FWHM of the XRC of the (10-12) AlN was 298 arcsec, and the FWHM of the XRC of the (10-10)

AlN was 378 arcsec. Also, the roughness mean square (RMS) of the surface was 0.93 nm, and compared to before annealing, excellent crystalline properties and surface smoothness were seen.

EXAMPLE 11

The AlN/sapphire substrate used herein was formed in Example 10 by MOVPE, and is one of the four equally formed pieces. Annealing was performed in Example 11 in a manner similar to Example 10 other than that the $N_2/CO$ mixed gas ratio was set to 0.50/0.50, and that the annealing temperature was set to 1750° C.

As a result, the crystalline properties of the AlN layer were as follows: the FWHM of the XRC of the (0002) AlN was 370 arcsec, the FWHM of the XRC of the (10-12) AlN was 446 arcsec, and the FWHM of the XRC of the (10-10) AlN was 507 arcsec. Compared to before annealing, the FWHM of the XRC of the (0002)AlN worsened slightly, but the FWHM of the XRC of the (10-12) and (10-10) AlN improved, and compared to before annealing, both crystalline properties and surface smoothness have improved.

EXAMPLE 12

First, an AlN layer was formed to approximately 3000 nm by MOVPE on the C surface of the sapphire substrate having a diameter of 2 inches, at a growth temperature of 1000° C. The crystalline properties of the AlN layer were as follows: the FWHM of the XRC of the (0002) AlN was 728 arcsec, the FWHM of the XRC of the (10-12) AlN was 1047 arcsec, and the FWHM of the XRC of the (10-10) AlN was 1203 arcsec. Also, the roughness mean square (RMS) of the surface was 32.23 nm. This AlN/sapphire substrate was used in the annealing process.

Annealing was performed in Example 12 in a manner similar to Example 1 other than that the $N_2/CO$ mixed gas ratio was set to 0.70/0.30, and that the annealing temperature was set to 1650° C.

Figure 6:
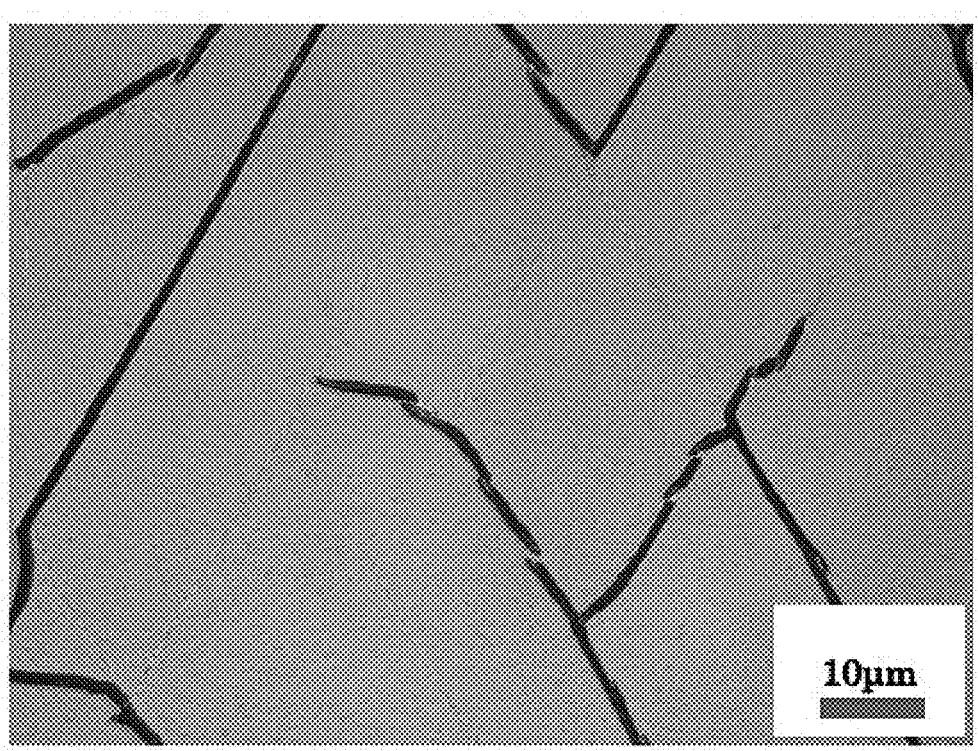
FIG. 6 shows a surface of an annealed AlN layer having a thickness of 3000 nm.

As a result, the crystalline properties of the AlN layer were as follows: the FWHM of the XRC of the (0002) AlN was 252 arcsec, the FWHM of the XRC of the (10-12) AlN was 540 arcsec, and the FWHM of the XRC of the (10-10) AlN was 849 arcsec, thus showing improved values, but as shown in FIG. 6, cracks have formed in the surface of the AlN layer. FIG. 6 shows a state in which cracks have formed in the surface of the annealed AlN layer as a result of annealing the AlN layer that is 3000 nm in thickness.

EXAMPLE 13

In Example 1, regrowth of an AlN layer was performed by MOVPE on the annealed AlN/sapphire substrate. The AlN layer was formed to a thickness of 2000 nm at a regrowth temperature for MOVPE of 1450° C., a regrowth pressure of 30 Torr, and an $NH_3$/TMA (trimethyl aluminum) flow rate of 584. As a result, the crystalline properties of the AlN layer were as follows: the FWHM of the XRC of the (0002) AlN was 110 arcsec, the FWHM of the XRC of the (10-12) AlN was 370 arcsec, and the FWHM of the XRC of the (10-10) AlN was 498 arcsec, thus showing an improvement in crystalline properties of the twisted component due to regrowth. Also, the roughness mean square of the surface was 1.04 nm and it was found that a smooth surface could be attained.

EXAMPLE 14

In Example 9, regrowth of an AlN layer was performed by MOVPE on the annealed AlN/sapphire substrate. The AlN layer was formed to a thickness of 2000 nm at a regrowth temperature for MOVPE of 1450° C., a regrowth pressure of 30 Torr, and an $NH_3$/TMA (trimethyl aluminum) flow rate of 584. As a result, the crystalline properties of the AlN layer were as follows: the FWHM of the XRC of the (0002) AlN was 218 arcsec, the FWHM of the XRC of the (10-12) AlN was 355 arcsec, and the FWHM of the XRC of the (10-10) AlN was 413 arcsec, thus showing an improvement in crystalline properties of the twisted component due to regrowth. Also, the roughness mean square of the surface was 3.25 nm and it was found that a smooth surface could be attained.

Figure 7:
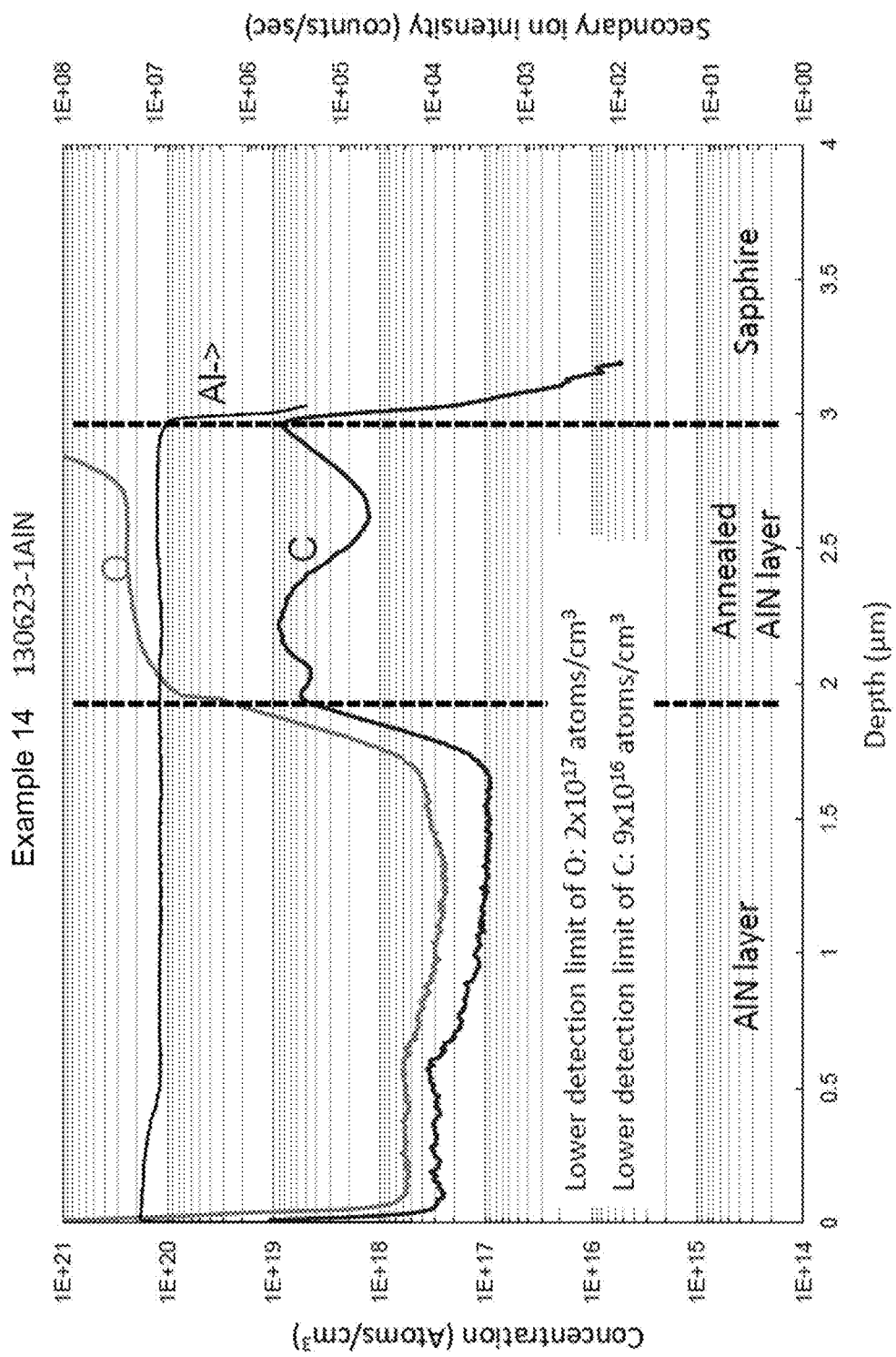
FIG. 7 is a graph showing a concentration profile of oxygen (O) and carbon (C) in an AlN regrowth layer and an annealed AlN layer obtained in Example 14.

FIG. 7 is a graph showing a concentration profile of oxygen (O) and carbon (C) in an AN regrowth layer and an annealed AlN layer obtained in Example 13. The density profile here can be attained along the depth direction of the AlN layer (AlN regrowth layer+annealed AlN layer) by a secondary ion mass spectrometry (SIMS) device. As shown in FIG. 7, it can be seen that the concentration of O in the annealed AlN layer is $10^{20}$ atoms/cm$^3$ or greater, and the concentration of C therein is $10^{18}$ to $10^{19}$ atoms/cm$^3$. On the other hand, the concentration of O and C in the AlN regrowth layer, which has been regrown by MOVPE, is low at $10^{18}$ atoms/cm$^3$. By performing regrowth at a higher than normal temperature, there is an additional effect of reducing the concentration of impurities.

The limit of quantitation of the secondary ion mass spectrometry device is $9 \times 10^{16}$ atoms/cm$^3$ for C, and $2 \times 10^{17}$ atoms/cm$^3$ for O.

It is thought that the dramatic increase in the concentration of C and O in the surface of the AlN regrowth layer (opposite to the annealed AlN layer) is the result of surface oxidation, contamination by organic substances, or the like. Thus, measurement results are used for the actual concentration of C and O in the AlN regrowth layer in regions excluding the vicinity of the surface affected by the factors above, or in other words, areas that are 0.1 μm or deeper below the surface. In the present specification, the portions affected by contamination are defined as the vicinity of the surface, and here, 0.1 μm from the surface is in the vicinity of the surface.

EXAMPLE 15

Figure 8:
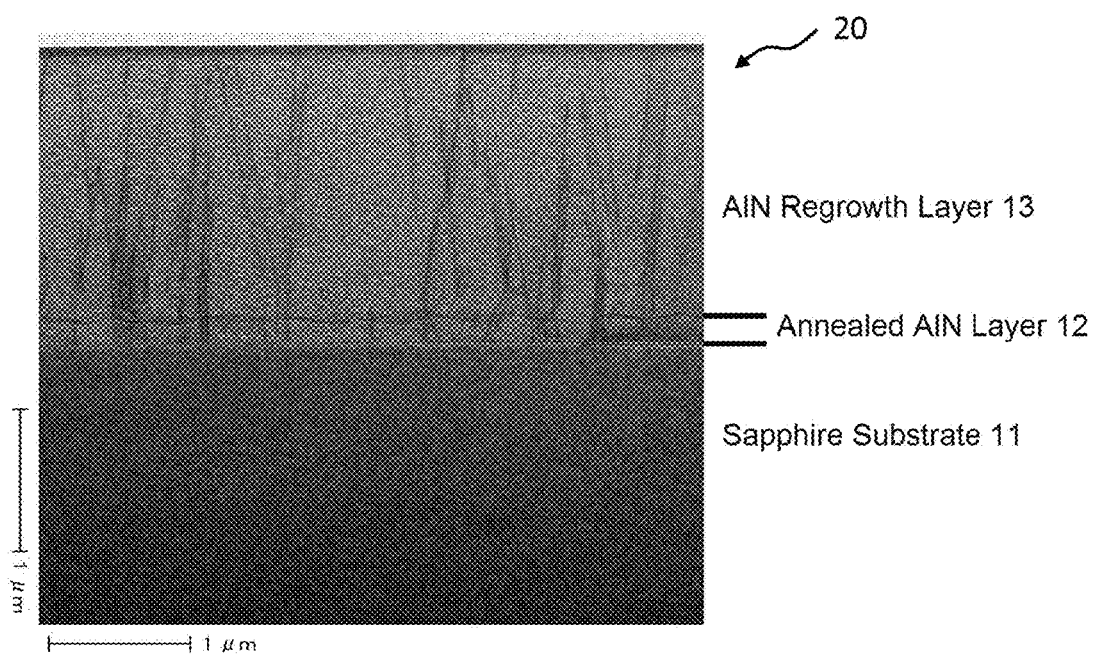
FIG. 8 is a photograph taken by transmission electron microscopy of a regrown aluminum nitride (AlN) layer/annealed AlN layer/sapphire substrate manufactured by the method for manufacturing an aluminum nitride layer of an embodiment of the present invention.

In Example 10, regrowth of an AlN layer was performed by MOVPE on the annealed AlN/sapphire substrate. The AlN layer was formed to a thickness of 2000 nm at a regrowth temperature for MOVPE of 1450° C., a regrowth pressure of 30 Torr, and an $TH_3$/TMA (trimethyl aluminum) flow rate of 584. As a result, the crystalline properties of the AlN layer were as follows: the FWHM of the XRC of the (0002) AlN was 119 arcsec, the FWHM of the XRC of the (10-12) AlN was 274 arcsec, and the FWHM of the XRC of the (10-10) AlN was 372 arcsec, thus showing an improvement in crystalline properties of the twisted component due to regrowth. Also, the roughness mean square of the surface was 1.10 nm and it was found that a smooth surface could be attained. A transmissive electron microscopic image of the cross-section of the obtained AlN layer is shown in FIG. 8.

Figure 9:
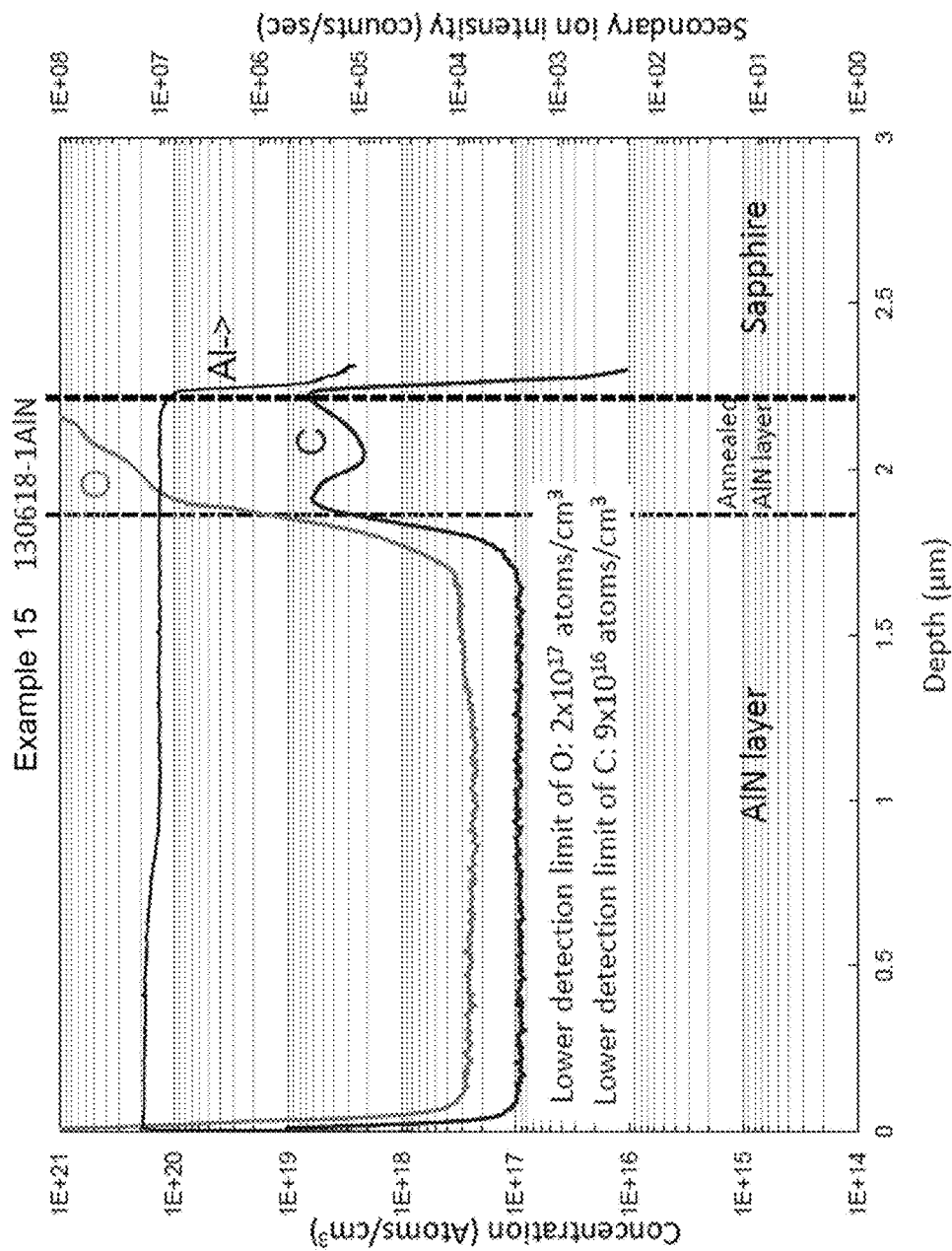
FIG. 9 is a graph showing a concentration profile of oxygen (O) and carbon (C) in an AlN regrowth layer and an annealed AlN layer obtained in Example 15.

FIG. 9 is a graph showing a concentration profile of oxygen (O) and carbon (C) in an AlN regrowth layer and an annealed AlN layer obtained in Example 14. Like FIG. 7, the density profile here can be attained along the depth direction of the AlN layer (AlN regrowth layer+annealed AlN layer) by a secondary ion mass spectrometry (SIMS) device. As shown in FIG. 9, it can be seen that the concentration of O in the annealed AlN layer is $10^{20}$ atoms/cm$^3$ or greater, and the concentration of C therein is $10^{18}$ to $10^{19}$ atoms/cm$^3$. On the other hand, the concentration of O and C in the AlN regrowth layer, which has been regrown by MOVPE, is low at $10^{18}$ atoms/cm3.

COMPARISON EXAMPLE 1

The AlN/sapphire substrate used herein was formed in Example 6 by MOVPE, and is one of the four equally formed pieces. Annealing was performed on the AlN/sapphire substrate in a manner similar to Example 7 except that instead of using the N$_2$/CO mixed gas, only the N$_2$ gas was introduced by the gas intake unit 3.

As a result, the crystalline properties of the AlN layer were as follows: the FWHM of the XRC of the (0002) AlN was 759 arcsec, the FWHM of the XRC of the (10-12) AlN was 997 arcsec, and the FWHM of the XRC of the (10-10) AlN was 774 arcsec, and thus, the crystalline properties thereof were worse compared to Example 7.

Here, the relation between the improvement in crystalline properties before and after annealing of the AlN layer and the annealing temperature will be described. A percentage of decrease of the (10-12) FWHM following the annealing (the percentage of decrease of the (10-12) FWHM ={(10-12) FWHM $_{before\ annealing}$ −(10-12)FWHM $_{after\ annealing}$}×100 /(10-12) FWHM $_{before\ annealing}$) in relation to the annealing temperature for the annealed AlN layer is as follows:

annealing temperature 1500° C. (Example 4): 43%
annealing temperature 1550° C. (Example 3): 54%
annealing temperature 1600° C. (Examples 2, 5, 6): 63-65%
annealing temperature 1650° C. (Examples 1, 7): 58-66%
annealing temperature 1700° C. (Examples 8, 9, 10): 67-75%
annealing temperature 1750° C. (Example 11): 62%.

The percentage of decrease in the (10-12) FWHM is affected by the temperature, film thickness, and the value prior to annealing, but the percentage of decrease of the (10-12) FWHM increases along with the increase in annealing temperature.

The presence or lack of CO in the atmosphere during annealing of the annealed AlN layer, or in other words, the difference between annealing in the N$_2$/CO mixed gas or only in N$_2$gas will be described. Comparing the percentage of decrease in the (10-12) FWHM between Example 7 and Comparison Example 1 at an annealing temperature of 1650° C. shows the following:

N$_2$/CO mixed gas (Example 7): 58%
N$_2$ gas (Comparison Example 1): 44%.

Similarly, comparing a percentage of decrease in the (0002) FWHM shows the following: annealing (the rate of decrease of the (0002)FWHM ={(0002) FWHM $_{before\ annealing}$ −(0002) FWHM $_{after\ annealing}$}×100 / (0002)FWHM $_{before\ annealing}$) shows the following:

N$_2$/CO mixed gas (Example 7): -182%
N$_2$ gas (Comparison Example 1): -2611%.

Thus, if annealing of the AlN layer is performed not in the mixed gas but in N$_2$ gas without CO, the (0002) FWHM after annealing increases.

Experimental conditions of Examples 1 to 14 and Comparison Examples 1 and 2, and the results of evaluating the AlN crystalline layers are listed in tables 1 to 4. From these results, it was found that by annealing the AlN layer formed on the sapphire substrate by MOVPE using the N$_2$/CO mixed gas, a dramatic increase in quality of the AlN layer can be attained. Also, by regrowing the AlN layer by MOVPE after annealing, it was found that an AlN regrowth layer of even better crystalline properties can be formed.

TABLE 1

| | | Example 1 | Example 2 | Example 3 | Example 4 | Example 5 | Example 6 |
|---|---|---|---|---|---|---|---|
| MOVPE AlN layer | Sample No. | 121214-2① | 121214-2② | 121214-2③ | 121214-2④ | 121214-1② | 121213-2④ |
| | Growth temperature (° C.) | 1150 | 1150 | 1150 | 1150 | 1150 | 1150 |
| | AlN layer thickness (nm) | 300 | 300 | 300 | 300 | 200 | 100 |
| | (0002)AlN XRC-FWHM (arcsec) | 90 | 90 | 90 | 90 | 43 | 28 |
| | (10-12)AlN XRC-FWHM (arcsec) | 1278 | 1278 | 1278 | 1278 | 1386 | 1771 |
| | (10-10)AlN XRC-FWHM (arcsec) | 1508 | 1508 | 1508 | 1508 | 1602 | 2217 |
| | Surface roughness RMS (nm) | 3.10 | 3.10 | 3.10 | 3.10 | 2.49 | 1.55 |
| annealing | No | 13c05 | 13c06 | 13c07 | 13c09 | 13c06 | 13c06 |
| | Annealing temperature (° C.) | 1650 | 1600 | 1550 | 1500 | 1600 | 1600 |
| | Partial pressures of N$_2$(atm) | 0.70 | 0.80 | 0.85 | 0.90 | 0.80 | 0.80 |
| | Partial pressures of CO (atm) | 0.30 | 0.20 | 0.15 | 0.10 | 0.20 | 0.20 |
| | Time (h) | 2 | 2 | 2 | 2 | 2 | 2 |
| | (0002)AlN | 32 | 97 | 43 | 36 | 36 | 39 |

TABLE 1-continued

|  | Example 1 | Example 2 | Example 3 | Example 4 | Example 5 | Example 6 |
|---|---|---|---|---|---|---|
| XRC-FWHM (arcsec) |  |  |  |  |  |  |
| (10-12)AlN XRC-FWHM (arcsec) | 424 | 468 | 579 | 730 | 482 | 615 |
| (10-10)AlN XRC-FWHM (arcsec) | 532 | 662 | 867 | 1144 | 619 | 838 |
| Surface roughness RMS (nm) | 0.49 | 0.63 | 1.21 | 2.65 | 1.57 | 0.55 |

TABLE 2

|  |  | Example 7 | Example 8 | Example 9 | Example 10 | Example 11 | Example 12 |
|---|---|---|---|---|---|---|---|
| MOVPE AlN Layer | Sample No. | 121213-2③ | 130406-1-② | 130406-5-② | 130411-2-② | 130411-2-③ | 130812-3 |
|  | growth temperature (° C.) | 1150 | 1150 | 1150 | 1200 | 1200 | 1000 |
|  | AlN layer thickness (nm) | 100 | 650 | 1000 | 300 | 300 | 3000 |
|  | (0002)AlN XRC-FWHM (arcsec) | 28 | 476 | 439 | 88 | 88 | 728 |
|  | (10-12)AlN XRC-FWHM (arcsec) | 1771 | 1056 | 875 | 1171 | 1171 | 1047 |
|  | (10-10)AlN XRC-FWHM (arcsec) | 2217 | 1282 | 952 | 1440 | 1440 | 1203 |
|  | Surface roughness RMS (nm) | 1.55 | 9.78 | 14.20 | 4.05 | 4.05 | 32.23 |
| Annealing | No | 13c05 | 13c38 | 13c38 | 13c38 | 13c78 | 13c117 |
|  | Annealing temperature (° C.) | 1650 | 1700 | 1700 | 1700 | 1750 | 1650 |
|  | partial pressures of $N_2$(atm) | 0.70 | 0.60 | 0.60 | 0.60 | 0.5 | 0.7 |
|  | partial pressures of CO(atm) | 0.30 | 0.40 | 0.40 | 0.40 | 0.5 | 0.3 |
|  | Time (h) | 2 | 2 | 2 | 2 | 2 | 2 |
|  | (0002)AlN XRC-FWHM (arcsec) | 79 | 133 | 205 | 75 | 370 | 252 |
|  | (10-12)AlN XRC-FWHM (arcsec) | 734 | 259 | 288 | 298 | 446 | 540 |
|  | (10-10)AlN XRC-FWHM (arcsec) | 540 | 374 | 511 | 378 | 507 | 849 |
|  | Surface roughness RMS (nm) | 0.43 | 1.34 | 7.50 | 0.93 |  |  |

TABLE 3

| | | Example 13 | Example 14 | Example 15 |
|---|---|---|---|---|
| MOVPE regrowth AlN layer | No | 130424-1AlN | 130623-1AlN | 130618-1AlN |
| | Regrowth temperature (° C.) | 1450 | 1450 | 1450 |
| | Regrowth pressure (Torr) | 30 | 30 | 30 |
| | $NH_3$/TMA flow rate | 584 | 584 | 584 |
| | AlN layer thickness (nm) | 2000 | 2000 | 2000 |
| | (0002)AlN XRC-FWHM (arcsec) | 110 | 218 | 119 |
| | (10-12)AlN XRC-FWHM (arcsec) | 370 | 355 | 274 |
| | (10-10)AlN XRC-FWHM (arcsec) | 498 | 413 | 372 |
| | Surface roughness RMS (nm) | 1.04 | 3.25 | 1.10 |

TABLE 4

| | | Comparative Example 1 |
|---|---|---|
| MOVPE AlN Layer | Sample No. | 121213-2 ② |
| | Growth temperature (° C.) | 1150 |
| | AlN layer thickness (nm) | 100 |
| | (0002)AlN XRC-FWHM (arcsec) | 28 |
| | (10-12)AlN XRC-FWHM (arcsec) | 1771 |
| | (10-10)AlN XRC-FWHM (arcsec) | 2217 |
| | Surface roughness RMS (nm) | 1.55 |
| Annealing | No | 13c01 |
| | Annealing temperature (° C.) | 1650 |
| | Partial pressure of $N_2$(atm) | 1.00 |
| | Partial pressure of CO(atm) | 0.00 |
| | Time (h) | 2 |
| | (0002)AlN XRC-FWHM (arcsec) | 759 |
| | (10-12)AlN XRC-FWHM (arcsec) | 997 |
| | (10-10)AlN XRC-FWHM (arcsec) | 774 |
| | Surface roughness RMS (nm) | |

As described above, according to the present invention, after forming the aluminum nitride (AlN) layer on a substrate such as a sapphire substrate, a silicon carbide (SiC) substrate, or an aluminum nitride (AlN) substrate, the aluminum nitride layer is annealed at a high temperature of 1500° C. or greater, thereby dramatically suppressing surface roughness of the AlN layer to make it smooth.

In Examples 13 to 15 above, the AlN layer is regrown on the AlN buffer layer. As described above, the regrowth layer is not limited to being the AlN layer, and the following can alternatively be used: an $Al_xGa_yIn_{(1-x-y)}N$ layer (0≤x≤1, 0≤y≤1, and x+y≤1), or a multilayer structure including an AlN layer and an $Al_xGa_yIn_{(1-x-y)}N$ layer (0≤x≤1, 0≤y≤1, and x+y≤1). Even in such a case, it is possible to form a layer having a high quality crystalline structure as in the AlN regrowth layer.

If a GaN layer was formed with x=0 and y=1, a layer having excellent crystalline properties was formed as follows: the full width at half maximum (FWHM) of the (0002) x-ray rocking curve (XRC) was 80 arcsec and the FWHM of the XRC of the (10-12) AlN was 250arcsec.

Also, when an $Al_{0.7}Ga_{0.3}$ layer where x=0.7 and y=0.3 was formed, it was possible to form a layer having excellent crystalline properties in which the FWHM of the XRC of (0002) AlN was 85 arcsec and the FWHM of the XRC of the (10-12) AlN was 387 arcsec.

Also, applications for an AlN layer where x=1 and y=0 and an $Al_{0.7}Ga_{0.3}$ layer where x=0.7 and y=0.3 include a base crystal for forming devices such as deep ultraviolet LEDs. Also, there is great expectation for $Al_{0.17}In_{0.83}N$ layers where x=0.17, y=0, and (1-x-y)=0.83 to serve as crystals that are lattice-matched with GaN.

This $Al_xGa_yIn_{(1-x-y)}N$ layer (0≤x≤1, 0≤y≤1, and x+y≤1) can be manufactured by MOVPE or the like, for example, using TMA (trimethyl aluminum), TMG (trimethyl gallium), and TMI (trimethyl indium) as the group 3 materials and $NH_3$ as the group 5 material. By performing crystal growth on the AlN layer and the $Al_xGa_yN_{(y=1-x)}N$ layer at 1200 to 1500° C., crystal growth can be performed on the mixed crystal layer (1-x-y>0) at 600 to 1000° C. with nitrogen as the carrier gas.

Excellent crystal growth can be expected for such $Al_xGa_yIn_{(1-x-y)}N$ layers (0≤x≤1, 0≤y≤1, and x+y≤1) by using them for making devices such as LEDs or making substrates, using such layers in substrates for growth of thick films for use in substrate, or the like. Thus, the thickness of the growth layer to be regrown can be within a wide range of 50 nm to 10 mm, and it is possible to form a regrowth layer that is highly crystalline.

By annealing a substrate having an AlN layer in nitrogen/carbon monoxide ($N_2$/CO) mixed gas, or by having a stable annealing temperature and ratio of the nitrogen/carbon monoxide ($N_2$/CO) mixed gas in a state close to chemical equilibrium shown with the bold solid line La in the $Al_2O_3$—AlN—C—$N_2$—CO system stable phase drawing (FIG. 2), the surface smoothness can be dramatically improved as described above, with the roughness mean square being 1.5 nm or less. Also, adding inert gases such as noble gases (helium, neon, argon, or the like) to the nitrogen/carbon monoxide ($N_2$/CO) mixed gas is within the scope of the present invention. Additionally, with regard to the total pressure during annealing, as long as the ratio of the nitrogen/carbon monoxide ($N_2$/CO) mixed gas is controlled so as to be at the chemical equilibrium state shown in FIG. 2, similar effects can be attained.

As described above, according to the present embodiment, a substrate having an aluminum nitride (AlN) layer and a method for manufacturing an aluminum nitride (AlN) layer by which it is possible to drastically improve crystalline properties of an AlN layer using growth conditions of the currently used MOCVD method without the need for complex processes such as forming grooves in a sapphire substrate can be provided, thereby being able to form a high efficiency light-emitting diode (LED) or laser diode (LD) device.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A multi-layered substrate comprising:
a base substrate made of a material selected from the group consisting of sapphire, silicon carbide (SiC), and aluminum nitride (AlN); and
an annealed aluminum nitride layer formed on the base substrate and having a thickness of at least 100 nm,
wherein the annealed aluminum nitride layer is formed by forming an aluminum nitride layer on the base substrate at a forming temperature; and annealing the aluminum nitride layer at an annealing temperature that is above the forming temperature and in a mixed gas atmosphere comprising nitrogen gas ($N_2$) and carbon monoxide gas (CO), and
wherein the mixed gas atmosphere has a mixture ratio of $N_2$ gas/CO gas that ranges from 0.95/0.05 to 0.4/0.6.

2. The multi-layered substrate according to claim 1, wherein the annealing temperature and the mixture ratio of the mixed gas atmosphere are determined on the basis of a phase stability diagram of an $Al_2O_3$—AlN—C—$N_2$—CO system so that the annealing temperature ranges from 1500° C. to 1750° C., and the mixture ratio ranges from 0.95/0.05 to 0.4/0.6.

3. The multi-layered substrate according to claim 1, wherein the annealing temperature and the mixture ratio are set, within a phase stability diagram of an $Al_2O_3$—AlN—C—$N_2$—CO system, to be in a vicinity of a temperature and a mixture ratio at which a chemical equilibrium coexistence state is exhibited between an AlN phase and an $Al_2O_3$ phase so that the annealing temperature ranges from 1500° C. to 1750° C. and the mixture ratio ranges from 0.95/0.05 to 0.4/0.6.

4. The multi-layered substrate according to claim 1, further comprising an upper layer made of $Al_xGa_yIn_{(1-x-y)}N$ layer where ($0 \leq x \leq 1$, $0 \leq y \leq 1$, and $x+y \leq 1$), formed by regrowth on at least a portion of the annealed aluminum nitride layer.

5. The multi-layered substrate according to claim 4, wherein the annealed aluminum nitride layer has a concentration of carbon (C) that is greater than that included in a region of the upper layer, excluding a surface portion in a vicinity of a surface thereof.

6. The multi-layered substrate according to claim 4, wherein at least one of the annealed aluminum nitride layer and the upper layer has a (10-12) plane having at least one of:
(a) an x-ray diffraction rocking curve having a full width at half maximum of the (10-12) plane that is 300 arcsec or less, and
(b) a surface roughness root mean square (RMS) that is 1.5 nm or less.

7. The multi-layered substrate according to claim 4, wherein the annealed aluminum nitride layer has a concentration of carbon (C) that is greater than that of the upper layer except for a portion of the upper layer that is adjacent to a boundary surface between the annealed aluminum nitride layer and the upper layer.

8. The multi-layered substrate according to claim 7, wherein the annealed aluminum nitride layer has a concentration of carbon (C) that ranges from $10^{18}$ to $10^{19}$ atoms/$cm^3$, and a concentration of oxygen (O) that is $10^{20}$ atoms/$cm^3$ or greater.

9. The multi-layered substrate according to claim 7, wherein the annealed aluminum nitride layer has a thickness ranging from 100 nm to 3000 nm.

10. The multi-layered substrate according to claim 9, wherein the annealed aluminum nitride layer has the thickness ranging from 100 nm to 1000 nm.

11. The multi-layered substrate according to claim 1, wherein the annealed aluminum nitride layer has a concentration of carbon (C) that ranges from $10^{18}$ to $10^{19}$ atoms/$cm^3$, and a concentration of oxygen (O) that is $10^{20}$ atoms/$cm^3$ or greater.

12. A method for manufacturing a multi-layered substrate, comprising:
forming an aluminum nitride layer having a thickness of at least 100 nm on a base substrate at a forming temperature; and
annealing the aluminum nitride layer to form an annealed aluminum nitride layer at an annealing temperature that is above the forming temperature and in a mixed gas atmosphere comprising nitrogen gas ($N_2$) and carbon monoxide gas (CO) present in a mixture ratio of $N_2$ gas/CO gas that ranges from 0.95/0.05 to 0.4/0.6.

13. The method according to claim 12, wherein the annealing temperature and the mixture ratio during the annealing are determined on the basis of a phase stability diagram of an $Al_2O_3$—AlN—C—$N_2$—CO system, the annealing temperature ranging from 1500° C. to 1750° C., and the mixture ratio ranging from 0.95/0.05 to 0.4/0.6.

14. The method according to claim 13, further comprising regrowing an upper layer that is made of $Al_xGa_yIn_{(1-x-y)}N$ layer ($0 \leq x \leq 1$, $0 \leq y < 1$, and $x+y \leq 1$), on at least a portion of the annealed aluminum nitride-(AlN) layer.

15. The method according to claim 13, wherein the aluminum nitride layer is formed on the base substrate to have a thickness that ranges from 100 nm to 3000 nm.

16. The method according to claim 12, wherein the annealing temperature and the mixture ratio during annealing are set, within a phase stability diagram of an $Al_2O_3$—AlN—C—$N_2$—CO system, to be in a vicinity of a temperature and mixture ratio at which a chemical equilibrium coexistence state is exhibited between an AlN phase and an $Al_2O_3$ phase so that the annealing temperature ranges from 1500° C. to 1750° C. and the mixture ratio ranges from 0.95/0.05 to 0.4/0.6.

17. The method according to claim 12, wherein forming the aluminum nitride layer is accomplished using any one of metal organic vapor phase epitaxy (MOVPE), sputtering, hydride vapor phase epitaxy (HVPE), and molecular beam epitaxy (MBE).

* * * * *